US008378450B2

(12) United States Patent
Booth, Jr. et al.

(10) Patent No.: US 8,378,450 B2
(45) Date of Patent: Feb. 19, 2013

(54) INTERDIGITATED VERTICAL PARALLEL CAPACITOR

(75) Inventors: Roger A. Booth, Jr., Hopewell Junction, NY (US); Douglas D. Coolbaugh, Hopewell Junction, NY (US); Ebenezer E. Eshun, Hopewell Junction, NY (US); Zhong-Xiang He, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 118 days.

(21) Appl. No.: 12/548,484

(22) Filed: Aug. 27, 2009

(65) Prior Publication Data
US 2011/0049674 A1 Mar. 3, 2011

(51) Int. Cl.
H01L 29/92 (2006.01)
H01L 21/02 (2006.01)

(52) U.S. Cl. ............ 257/532; 438/396; 257/E29.343; 257/E21.008

(58) Field of Classification Search .......... 257/532, 257/E29.343, E21.008; 438/396
See application file for complete search history.

(56) References Cited

U.S. PATENT DOCUMENTS

| | | | |
|---|---|---|---|
| 5,208,725 A | 5/1993 | Akcasu | |
| 5,583,359 A | 12/1996 | Ng et al. | |
| 6,653,681 B2 | 11/2003 | Appel | |
| 6,690,570 B2 | 2/2004 | Hajimiri et al. | |
| 6,819,542 B2 | 11/2004 | Tsai et al. | |
| 6,822,312 B2 * | 11/2004 | Sowlati et al. ............ 257/532 |
| 7,009,236 B2 | 3/2006 | Chen et al. | |
| 7,009,832 B1 | 3/2006 | Chen et al. | |
| 7,095,072 B2 | 8/2006 | Furumiya et al. | |
| 7,116,544 B1 | 10/2006 | Sutardja | |
| 7,126,809 B2 | 10/2006 | Iioka et al. | |
| 7,151,660 B2 | 12/2006 | Chen et al. | |
| 7,200,930 B2 | 4/2007 | Khandros et al. | |
| 7,209,340 B2 | 4/2007 | Iioka et al. | |
| 7,211,483 B2 | 5/2007 | Chen et al | |
| 7,259,956 B2 | 8/2007 | Fong et al. | |

(Continued)

FOREIGN PATENT DOCUMENTS
DE 10217566 11/2003

OTHER PUBLICATIONS

Application No. PCT/US2010/046742, International Search Report dated Apr. 27, 2011.

*Primary Examiner* — Calvin Lee
*Assistant Examiner* — Monica D Harrison
(74) *Attorney, Agent, or Firm* — Scully, Scott, Murphy & Presser, P.C.; Katherine S. Brown

(57) ABSTRACT

An interdigitated structure may include at least one first metal line, at least one second metal line parallel to the at least one first metal line and separated from the at least one first metal line, and a third metal line contacting ends of the at least one first metal line and separated from the at least one second metal line. The at least one first metal line does not vertically contact any metal via and at least one second metal line may vertically contact at least one metal via. Multiple layers of interdigitated structure may be vertically stacked. Alternately, an interdigitated structure may include a plurality of first metal lines and a plurality of second metal lines, each metal line not vertically contacting any metal via. Multiple instances of interdigitated structure may be laterally replicated and adjoined, with or without rotation, and/or vertically stacked to form a capacitor.

25 Claims, 11 Drawing Sheets

U.S. PATENT DOCUMENTS

| | | |
|---|---|---|
| 7,327,555 B2 | 2/2008 | Yeh et al. |
| 7,352,059 B2 | 4/2008 | O'Mahony et al. |
| 7,812,424 B2 * | 10/2010 | Barth et al. .................. 257/532 |
| 2004/0031982 A1 | 2/2004 | Devries et al. |
| 2004/0174655 A1 | 9/2004 | Tsai et al. |
| 2005/0167719 A1 | 8/2005 | Chen et al. |
| 2005/0259379 A1 | 11/2005 | Bely et al. |
| 2006/0061935 A1 | 3/2006 | Schultz et al. |
| 2006/0086965 A1 | 4/2006 | Sakaguchi et al. |
| 2007/0123015 A1 | 5/2007 | Chinthakindi et al. |
| 2008/0054401 A1 | 3/2008 | Park |

* cited by examiner

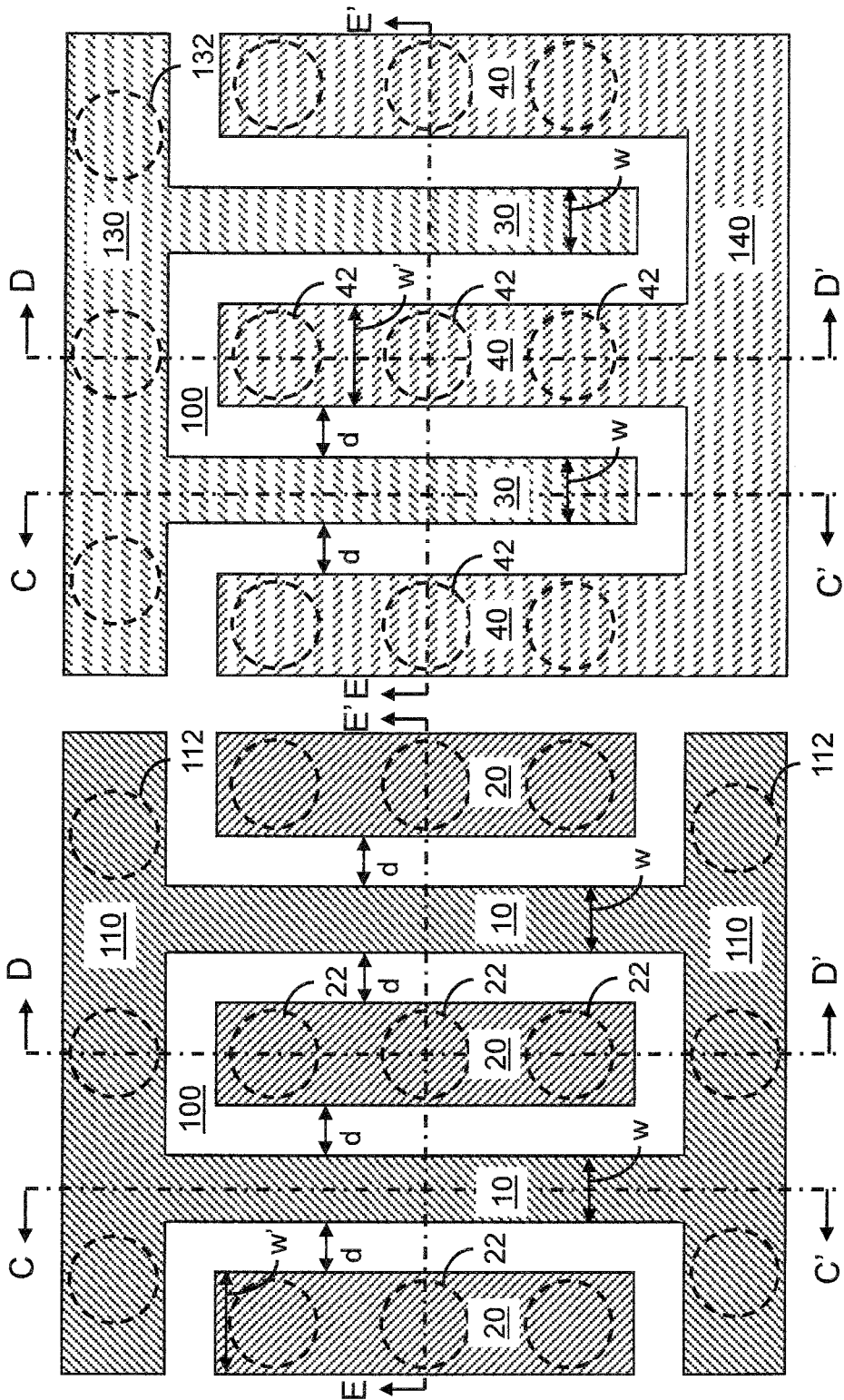

INTERDIGITATED VERTICAL PARALLEL CAPACITOR

BACKGROUND

The present invention relates to capacitor structures, and particularly to capacitor structures having interdigitated conductive lines, and methods of manufacturing the same.

Prior art back-end-of-line (BEOL) metal capacitors employ conductive lines embedded in a dielectric material layer. The conductive lines are formed as metal lines filling line trenches in the dielectric material layer at the same time when other metal lines for metal interconnect structures are formed. The distance between the conductive lines is typically a critical dimension, i.e., the smallest dimension that may be printed by lithographic methods. Because such BEOL metal capacitors are formed in the same processing steps that are employed to form other metal interconnect structures, such BEOL metal capacitors may be manufactured without incurring an additional processing cost.

Because of the relatively great separation distance between the metal lines, such a BEOL metal capacitor requires a relatively large area. While a smaller area for such BEOL metal capacitors is desirable, the line width of the conductive lines may not be reduced without increasing the risk for electrical shorts between the metal vias, which electrically connect the conductive lines to conductive structures in different levels, and other conductive structures located nearby. Particularly, metal vias tend to be formed with a wider diameter in an upper portion relative to a lower portion, thereby increasing the area of the metal via and consequently increasing the probability of electrical shorts when a metal via is located directly underneath a metal line.

Because the presence of a metal via directly underneath a metal line tends to widen the physical width of the metal line and increase the possibility of electrical shorts between a metal via and adjoining conductive structures, prior art BEOL metal capacitors face a limit in scaling triggered by the presence of the metal vias.

BRIEF SUMMARY

An interdigitated structure is provided, which includes at least one first metal line, at least one second metal line that is parallel to, and is separated from, the at least one first metal line, and a third metal line contacting ends of the at least one first metal line and separated from the at least one second metal line. The at least one first metal line does not vertically contact any metal via but the at least one second metal line may vertically contact at least one metal via. The at least one first metal line laterally contacts the third metal line, which may vertically contact at least another metal via. Each of the at least one first metal line is separated from one of the at least one second metal line by a constant separation distance, which may be a critical dimension for line spacing for a plurality of parallel lines. Each of the at least one first metal line may have a constant width, which may be a critical dimension for line width for the plurality of parallel lines.

Multiple layers of interdigitated structure may be vertically stacked such that metal lines not vertically contacting a metal via may be oriented along the same direction between vertically adjacent layers or along mutually perpendicular directions between vertically adjacent layers. The at least one first metal line and the third metal lines in the multiple layers of interdigitated structure constitute one electrode of a vertical parallel capacitor, and the at least one second metal line in the multiple layers and at least one fourth metal line laterally contacting some of the at least one second metal line constitute another electrode of the vertical parallel capacitor.

Another interdigitated structure is also provided, which includes a plurality of first metal lines and a plurality of second metal lines, each metal line not vertically contacting any metal via. Each of the plurality of first metal lines is laterally separated from the plurality of second metal lines. The plurality of first metal lines laterally contacts a third metal line, and the plurality of second metal lines laterally contacts a fourth metal line. Each of the plurality of first metal lines is separated from at least one the plurality of second metal lines by a constant separation distance, which may be a critical dimension for line spacing for a plurality of parallel lines. Each of the plurality of first metal lines and the plurality of second metal lines may have a constant width, which may be a critical dimension for line width for the plurality of parallel lines.

Multiple instances of interdigitated structure may be laterally replicated and adjoined, with or without rotation, to form a lateral array of interdigitated structures. Multiple interdigitated structures may be vertically stacked such that first and second pluralities of metal lines in each layer may be oriented along the same direction between vertically adjacent layers or along mutually perpendicular directions between vertically adjacent layers. The interdigitated structures may be laterally and vertically replicated with some metal vias connecting third metal lines across multiple levels and other metal vias connecting fourth metal vias across multiple levels. The pluralities of first metal lines and the third metal lines in the multiple layers of interdigitated structure constitutes one electrode of a vertical parallel capacitor, and the pluralities of second metal lines in the multiple layers and fourth metal lines constitutes another electrode of the vertical parallel capacitor.

According to an aspect of the present invention, a device structure is provided, which includes at least one dielectric layer located on a substrate; a plurality of interdigitated structures embedded in the at least one dielectric layer and vertically spaced from each other or one another, each of the plurality of interdigitated structures including at least one first metal line, at least one second metal line, and at least one third metal line; at least one first vertical conductive via, each having a top surface vertically contacting one of the at least one third metal line and a bottom surface vertically contacting another of the at least one third metal line; and at least one second vertical conductive via, each having a top surface vertically contacting one of the at least one second metal line and a bottom surface vertically contacting another of the at least one second metal line, wherein all of the at least one first metal line and the at least one third metal line are resistively connected to one another and are electrically isolated from the at least one second metal line, and all of the at least one second metal line are resistively connected to each other or one another.

According to another aspect of the present invention, another device structure is provided, which includes: at least one dielectric layer located on a substrate; a plurality of interdigitated structures embedded in the at least one dielectric layer and vertically spaced from each other or one another, each of the plurality of interdigitated structures including at least one first metal line, at least one second metal line, a third metal line, and a fourth metal line; at least one first vertical conductive via, each having a top surface vertically contacting a third metal line and a bottom surface vertically contacting another third metal line; and at least one second vertical conductive via, each having a top surface vertically contacting a fourth metal line and a bottom surface vertically contacting another fourth metal line, wherein all of the at least one first metal line and the plurality of third metal lines are resistively connected to one another and are electrically isolated from the at least one second metal line, and all of the at least one second metal line and the plurality of fourth metal lines are resistively connected to one another.

A method of forming a device structure is also provided, which includes: forming a semiconductor device on a substrate; forming at least one dielectric layer on the substrate; forming at least one metal interconnect structure including at least one interconnect-level metal line; forming a device structure including: a plurality of interdigitated structures embedded in the at least one dielectric layer and vertically spaced from each other or one another, each of the plurality of interdigitated structures including at least one first metal line, at least one second metal line, a third metal line, wherein all of the at least one first metal line and the plurality of third metal lines are resistively connected to one another to constitute one electrode of a capacitor structure and are electrically isolated from the at least one second metal line, and all of the at least one second metal line are resistively connected to one another to constitute another electrode of the capacitor structure; at least one first vertical conductive via electrically connected to the at least one first metal line and the plurality of third metal lines; and at least one second vertical conductive via electrically connected to the at least one second metal line, wherein one of the at least one first metal line and the at least one interconnect-level metal line are formed concurrently by deposition and planarization of a metal layer in trenches located within the at least one dielectric layer.

BRIEF DESCRIPTION OF THE SEVERAL VIEWS OF THE DRAWINGS

FIGS. 1A and 1B are horizontal cross-sectional views of a first exemplary device structure according to a first embodiment of the present invention along the horizontal planes A-A' and B-B', respectively, of FIGS. 1C and 1D.

DETAILED DESCRIPTION

Figures 1C, 1D:
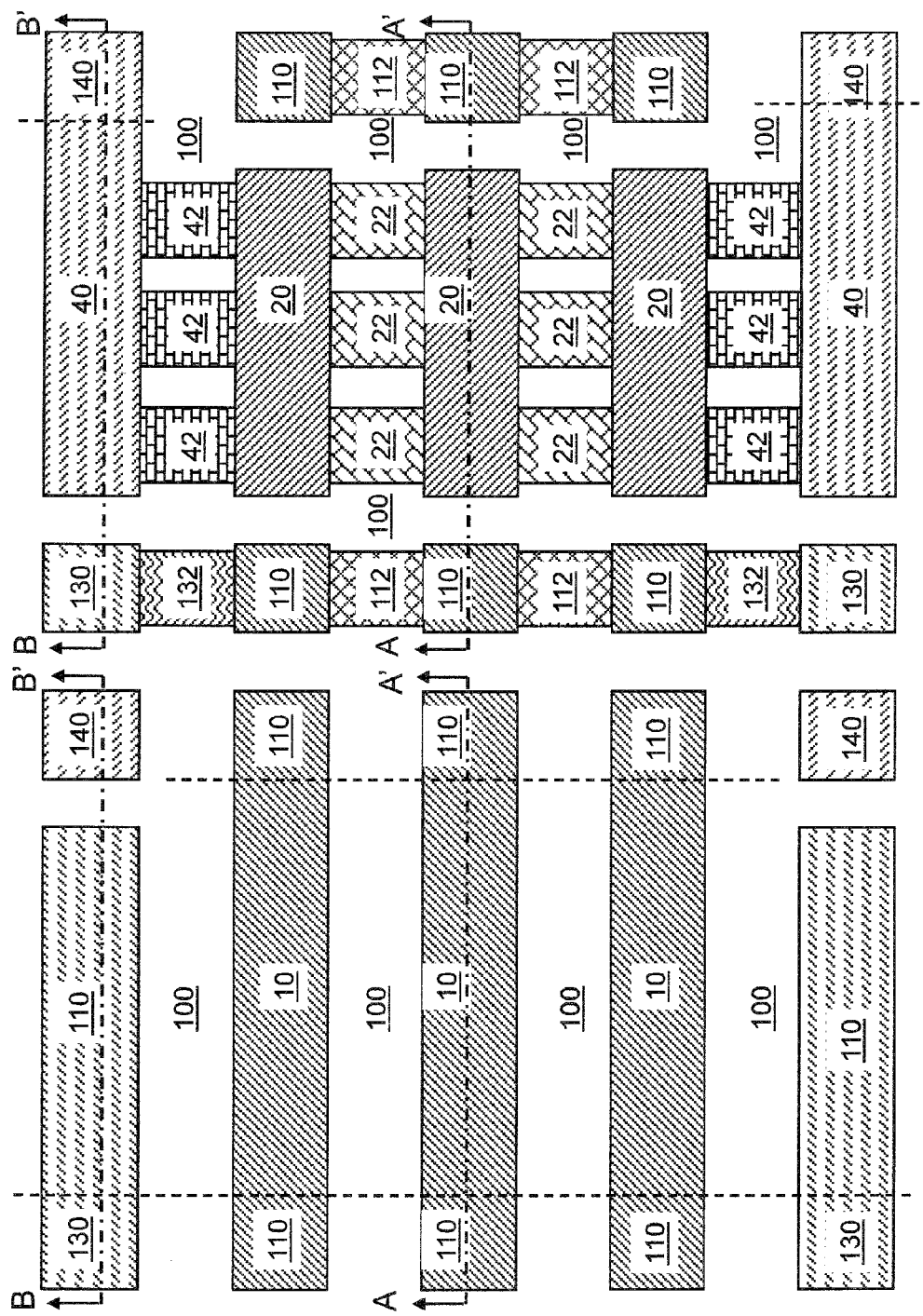
FIGS. 1C, 1D, and 1E are vertical cross-sectional views of the first exemplary device structure according to the first embodiment of the present invention along the vertical planes C-C', D-D', and E-E' of FIGS. 1A and 1B.
Figure 1E:
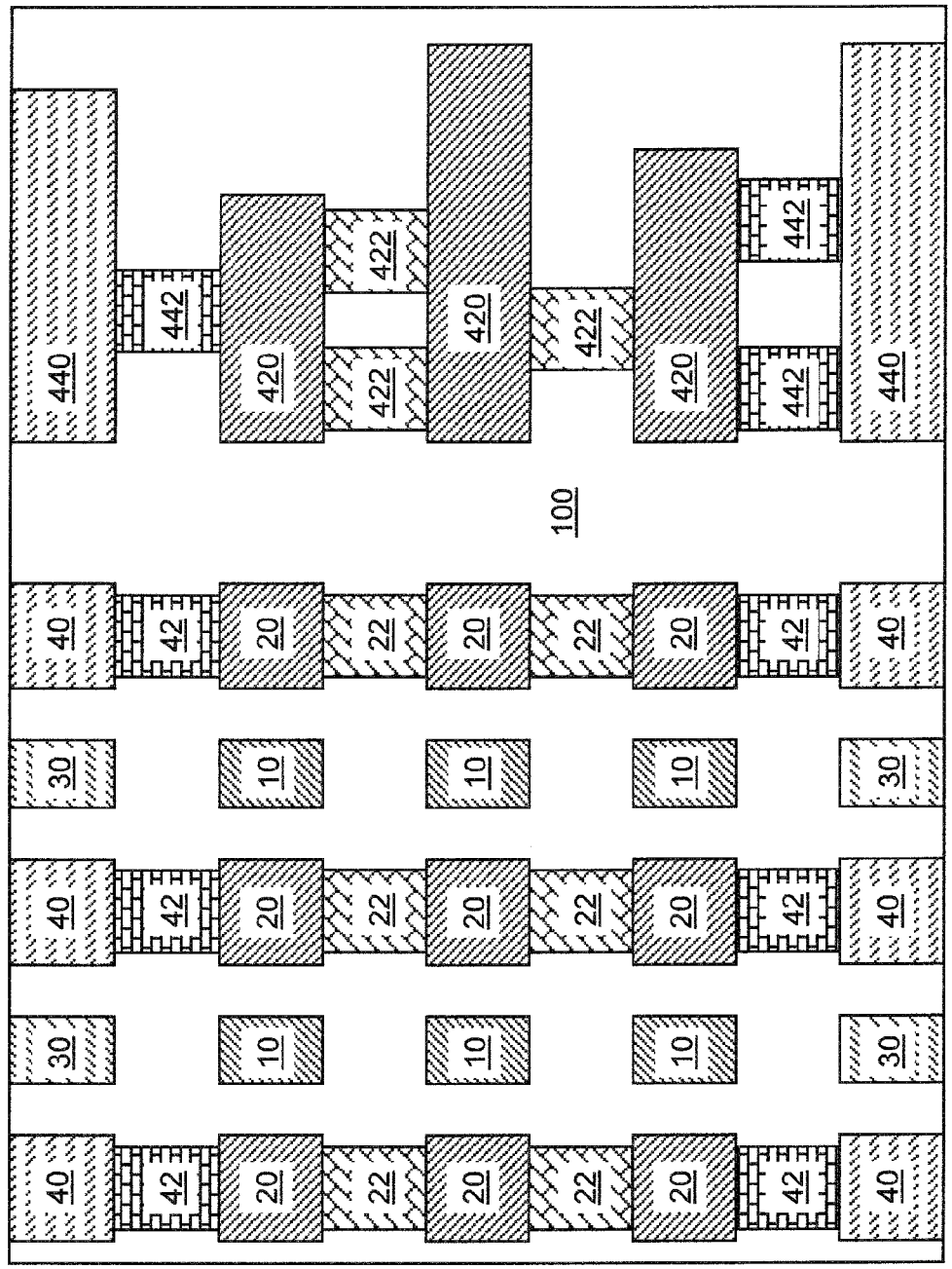
Figure 2A:
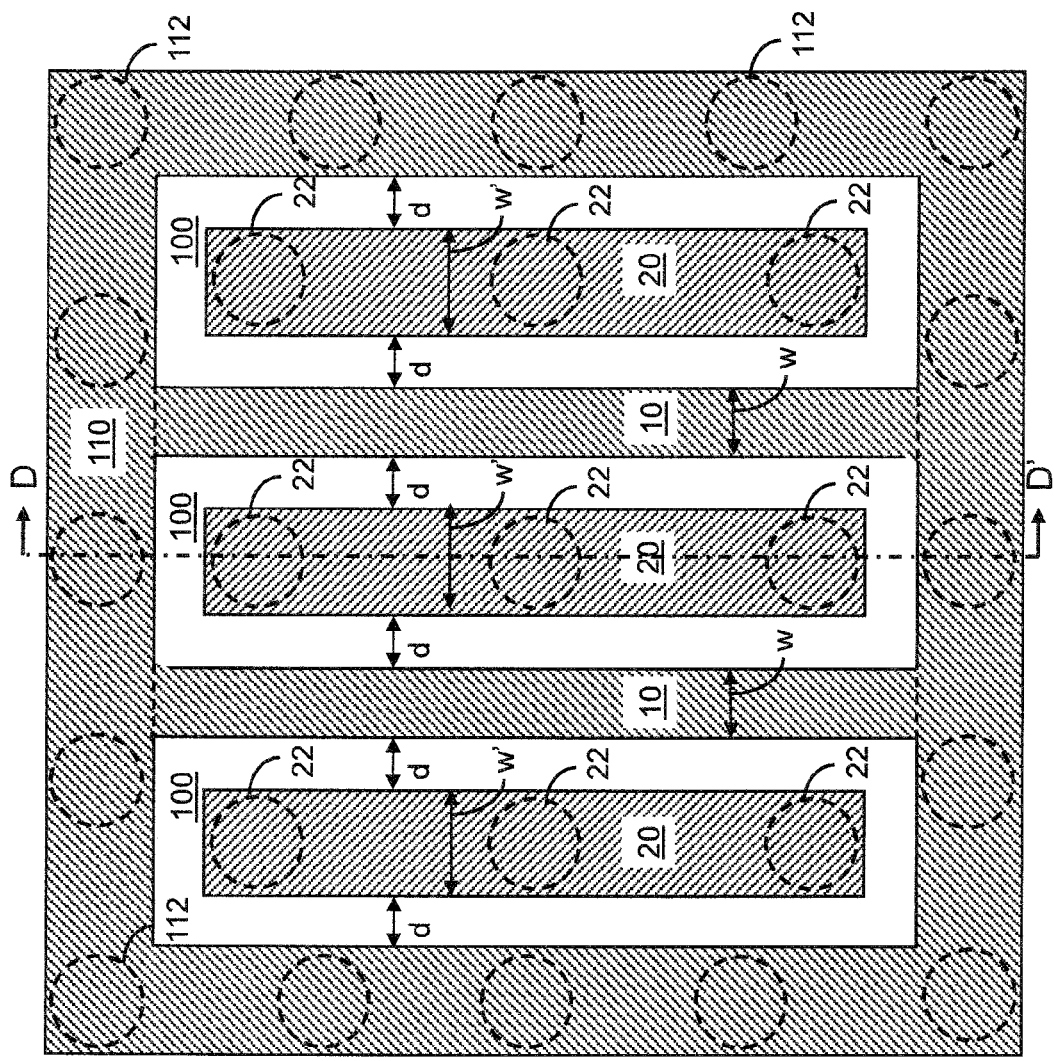
FIGS. 2A-2C are horizontal cross-sectional views of a second exemplary device structure according to a second embodiment of the present invention along the horizontal planes A-A', B-B', C-C', respectively of FIG. 2D.
Figure 2B:
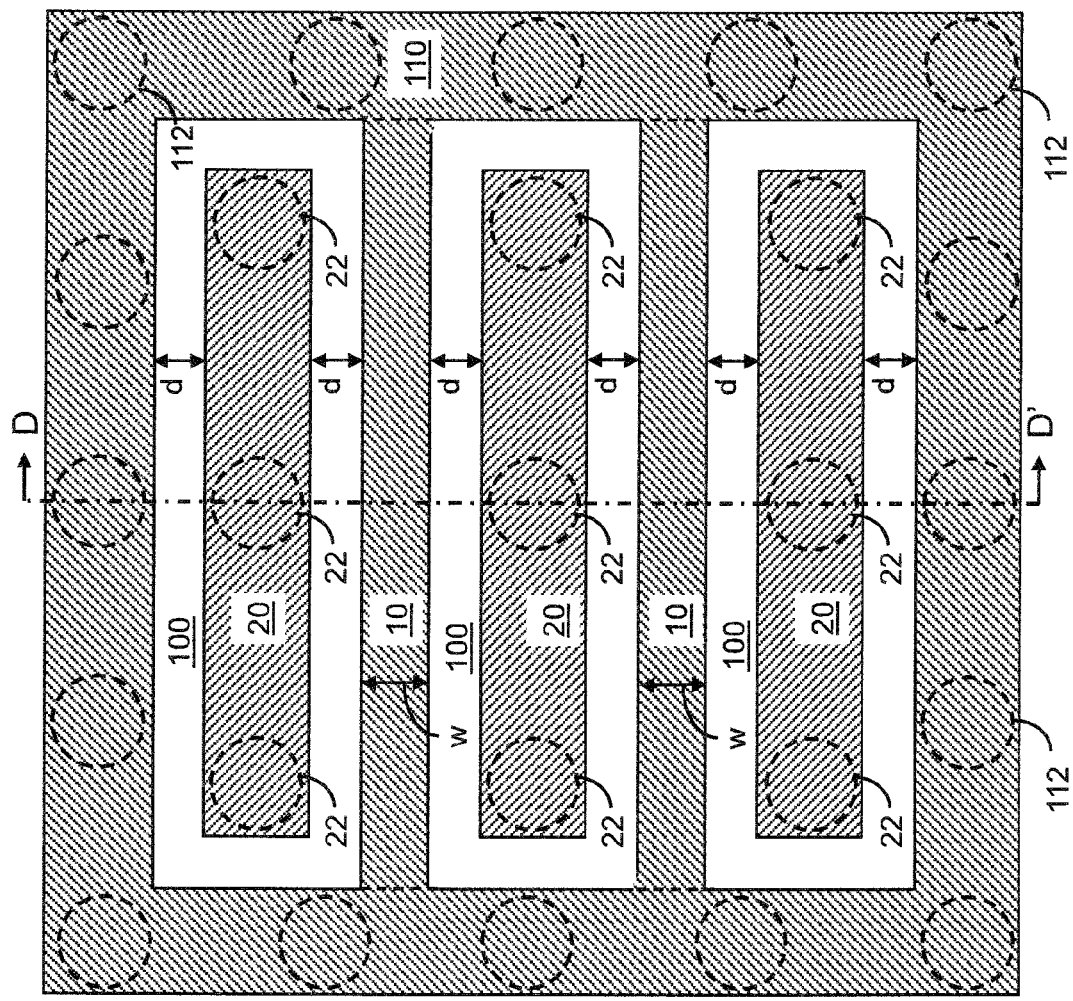
Figure 2C:
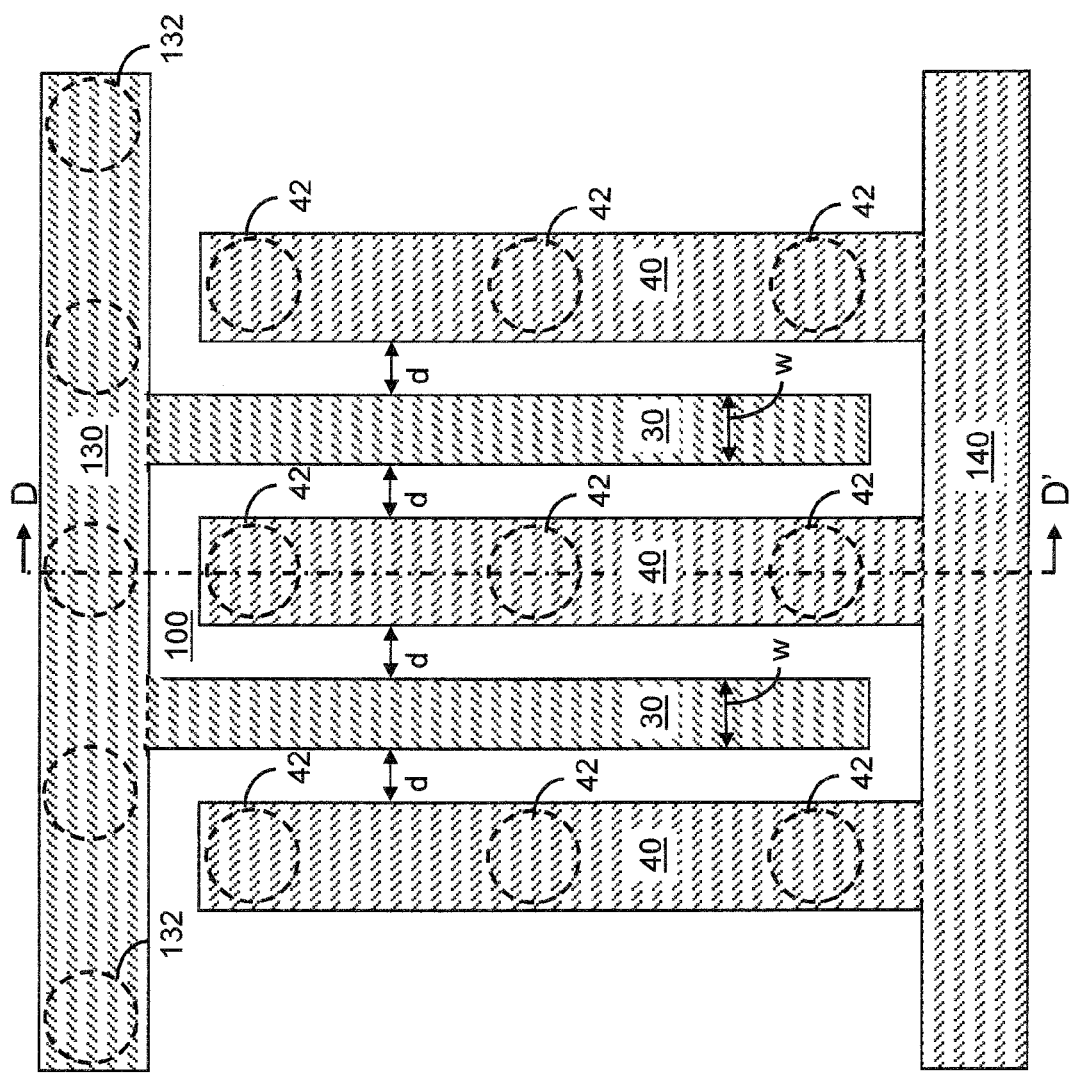
Figure 2D:
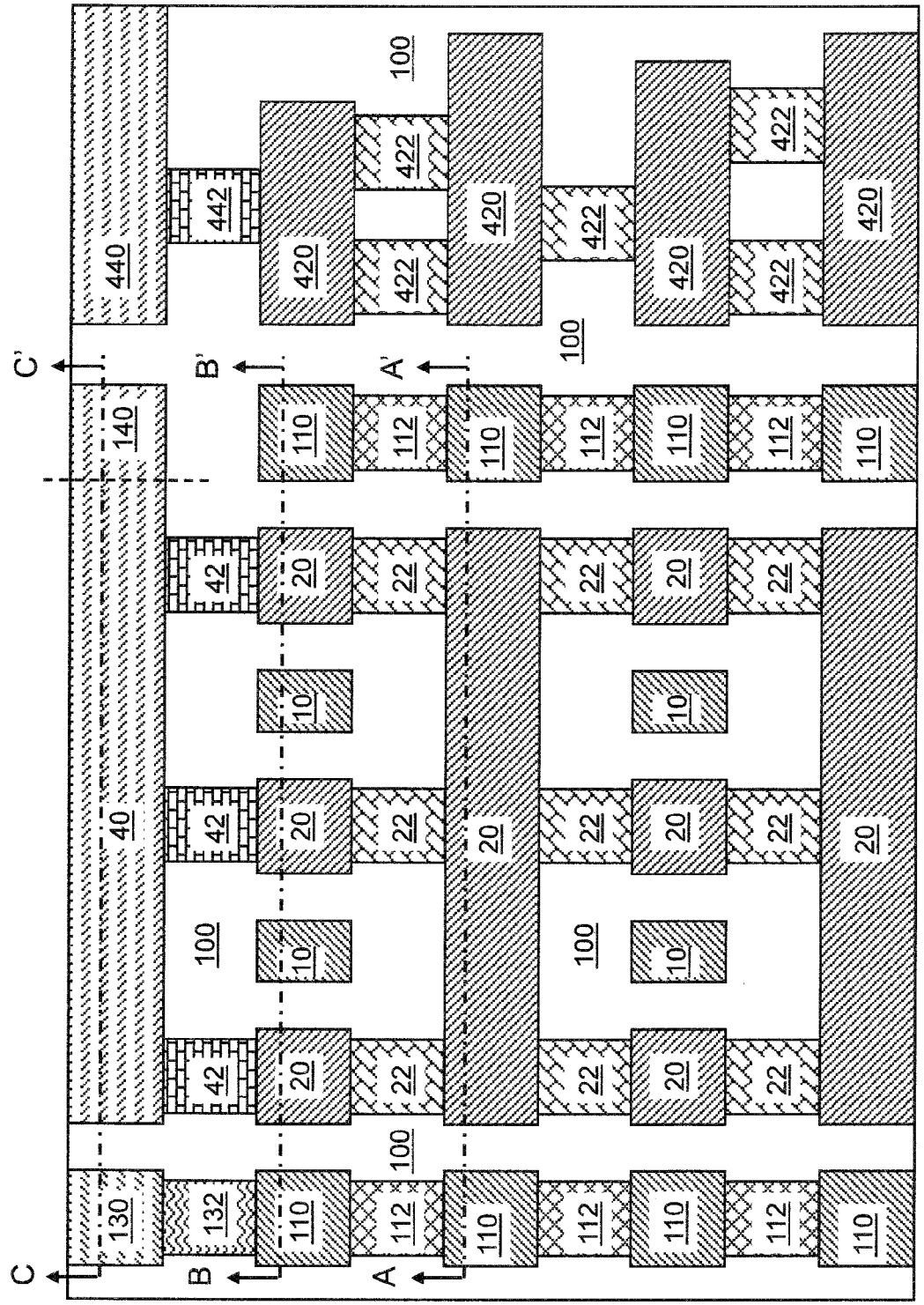
FIG. 2D is a vertical cross-sectional view of the second exemplary device structure according to the second embodiment of the present invention along the vertical plane D-D' of FIGS. 2A-2C.

As stated above, the present invention relates to capacitor structures having interdigitated conductive lines, and methods of manufacturing the same, which are described herein with accompanying figures. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

As used herein, a structural element is "resistively connected to" another structural element when the structural element directly contacts the other structural element or a contiguous conductive path is present between the structural element and the other structural element through at least one conductive elements. A structural element is "electrically isolated from" another structural element if there is no contiguous conductive path between the structural element and the other structural element. A structural element "contacts" another structural element when there is no intervening structural element and a physical contact is formed between the structural element and the other structural element. A structural element "vertically contacts" another structural element when an interface between the structural element and the other structural element is substantially horizontal. A structural element "horizontally contacts" another structural element when an interface between the structural element and the other structural element is substantially vertical. A structural element is "spaced" from another element if the structural element does not directly contact the other structural element. An interdigitated structure is a structure having at least two sub-structures wherein each of the sub-structures includes at least one laterally extending portion, and wherein sidewalls of adjacent sub-structures along the laterally extending direction are located proximate to each other. A pair of elements of a type is "vertically adjacent" if there is no intervening element of the same type between the pair of elements of the same type.

Referring to FIGS. 1A-1E, a first exemplary device structure according to a first embodiment of the present invention includes at least one dielectric layer 100, a plurality of interdigitated structures embedded therein, at least one first vertical conductive via, and at least one second vertical conductive via. The at least one dielectric layer 100 is typically formed on a substrate (not shown), which may be a semiconductor substrate, an insulator substrate, a conductive substrate, or a combination thereof. In case the at least one dielectric layer 100 is formed on a semiconductor substrate, at least one semiconductor device may be formed on the semiconductor substrate. At least one metal interconnect structure including at least one interconnect-level metal line, i.e., at least one metal line that is formed at an interconnect-level, may be formed in the at least one dielectric layer 100 employing methods known in the art such as deposition of dielectric materials, lithographic patterning of the dielectric materials and formation of via holes and line trenches, deposition of conductive materials, and planarization.

The at least one dielectric layer 100 is one or more dielectric layer(s) each comprising a dielectric material. Each dielectric material may comprise an oxide based conventional dielectric material, which has a dielectric constant k from about 3.6 to about 3.9, or a low-k dielectric material, which has a dielectric constant k of about 3.0 or less, preferably less than about 2.8, and more preferably less than about 2.5. Non-limiting examples of the oxide based conventional dielectric material included undoped silicate glass (USG), fluorosilicate glass (FSG), borophosphosilicate glass (BPSG), and phosphosilicate glass (PSG). The low-k dielectric material may be a spin-on low-k dielectric material or a CVD low-k dielectric material, i.e., a low-k dielectric material deposited by chemical vapor deposition (CVD). An example of the spin-on low-k dielectric material is a thermosetting polyarylene ether, which is also commonly referred to as "Silicon Low-K", or "SiLK™." The term "polyarylene" herein denotes aryl moieties or inertly substituted aryl moieties which are linked together by bonds, fused rings, or inert linking groups such as oxygen, sulfur, sulfone, sulfoxide, carbonyl, etc. Composition and deposition methods of the CVD low-k dielectric material are well known in the art. For example, the CVD low-k dielectric material may be a SiCOH dielectric containing a matrix of a hydrogenated oxidized silicon carbon material (SiCOH) comprising atoms of Si, C, O and H in a covalently bonded tri-dimensional network. Both the spin-on low-k dielectric material and the CVD low-k dielectric material may be porous, which decreases the dielectric constant of the at least one dielectric layer 100. The at least one dielectric layer 100 may comprise a stack of at least two of the oxide based conventional dielectric material, the spin-on low-k dielectric material, and the CVD low-k dielectric material. The at least one dielectric layer 100 functions as a node dielectric for the capacitor structure of the present invention.

The plurality of interdigitated structures are embedded in the at least one dielectric layer 100. Each interdigitated structure is formed at a line level of a metal interconnect structure. The plurality of interdigitated structures includes at least one first-type interdigitated structure and may include at least one second-type interdigitated structure. The first exemplary device structure includes at least two interdigitated structures located at different levels, i.e., at different vertical locations, and interconnected by vertical conductive vias. The first exemplary device structure may include at least two first-type interdigitated structures or at least one first-type interdigitated structure and at least one second-type interdigitated structure. Each interdigitated structure is vertically spaced from each other or one another. Each interdigitated structure includes at least one first metal line, at least one second metal line, and at least one third metal line.

A first-type interdigitated structure includes at least one first-type first metal line 10, at least one first-type second metal line 20, and two first-type third metal lines 110. Each of the at least one first-type first metal line 10, the at least one first-type second metal line 20, and the two first-type third metal lines 110 may have a rectangular horizontal cross-sectional area. Each of the at least one first-type first metal line 10 in a first-type interdigitated structure (10, 110, 20) may be laterally spaced at a constant distance from one of the at least one first-type second metal line 20 within the same first-type interdigitated structure (10, 110, 20).

Each of the at least one first-type first metal line 10 may have a constant width throughout, i.e., from one end portion at which the first-type first metal line 10 laterally contacts one of the at least one first-type third metal line 110 to the other end portion at which the first-type first metal line 10 laterally contacts another of the at least one first-type third metal line 110. Each end portion of the at least one first-type first metal line 10 laterally contacts one of the at least one first-type third metal line 110. The constant width of a first-type first metal line 10 is herein referred to as a constant first-line width w, which may be a critical dimension, i.e., the smallest dimension that may be printed by lithographic methods, for a line width in a nested parallel line structure.

Each of the at least one first-type second metal line 20 may have a constant width throughout, which is herein referred to as a constant second-line width w', which is preferably greater than the critical dimension for a line width in a nested parallel line structure. Preferably, the second-line width w' is greater than the first-line width w, and is greater than the diameter of vertical conductive vias connected thereto.

Each of the at least one first-type first metal line 10 may be separated from one of the at least one first-type second metal line 20 by a constant spacing d throughout the length of the first-type first metal line 10. The constant spacing d may be a critical dimension for a spacing between neighboring lines in a nested parallel line structure.

Each first-type second metal line 20 is laterally surrounded by the at least one dielectric layer 100 and does not laterally contact any conductive structure. Each first-type second metal line 20 in a first-type interdigitated structure (10, 110, 20) is electrically isolated from all other elements within the first-type interdigitated structure (10, 110, 20).

Each first-type interdigitated structure (10, 110, 20) includes two of first-type third metal lines 110 that do not contact each other. The two first-type third metal line 110 in each first-type interdigitated structure (10, 110, 20) are of integral construction, i.e., in a single contiguous piece, and of the same material composition. All of the at least one first-type first metal line 10 and the two first-type third metal line 110 within a first-type interdigitated structure (10, 110,20) are of integral construction. All of the at least one first-type first metal line 10, the at least one first-type second metal line 20, and the two first-type third metal line 110 within a first-type interdigitated structure (10, 110, 20) may be of the same material composition, and comprises at least conductive material, which may be selected from a metal and a metal compound. Non-limiting examples of the metal and the metal compound include W, Cu, Al, WN, TiN, TaN, and a combination thereof. Preferably, all of the at least one first-type first metal line 10, the at least one first-type second metal line 20, and the at least one first-type third metal line 110 within a first-type interdigitated structure (10, 110, 20) consist of conductive materials.

All of a top surface and all of a bottom surface, i.e., the entirety of the top surface and the entirety of the bottom surface, and a pair of sidewall surfaces of each of the at least one first-type first metal line 10 contact the at least one dielectric layer 100. Thus, all surfaces of the at least one first-type first metal line 10 not contacting a first-type third metal line 110 contact the at least one dielectric layer 100. All top surfaces of the at least one first-type first metal line 10, the at least one first-type second metal line 20, and the at least one first-type third metal line 110 within a first-type interdigitated structure (10, 110, 20) may be coplanar, i.e., located within a same horizontal plane. All bottom surfaces of the at least one first-type first metal line 10, the at least one first-type second metal line 20, and the at least one first-type third metal line 110 within a first-type interdigitated structure (10, 110, 20) may be coplanar.

A second-type interdigitated structure includes at least one second-type first metal line 30, at least one second-type second metal line 40, a second-type third metal line 130, and a second-type fourth metal line 140. Each of the at least one second-type first metal line 30, the at least one second-type second metal line 40, the second-type third metal line 130, and the second-type fourth metal line 130 may have a rectangular horizontal cross-sectional area. Each of the at least one second-type first metal line 30 in a second-type interdigitated structure (30, 130, 40, 140) may be laterally spaced at a constant distance from one of the at least one second-type second metal line 40 within the same second-type interdigitated structure (30, 130, 40, 140).

Each of the at least one second-type first metal line 30 may have a constant width throughout, i.e., from one end portion having a vertical end surface that contacts the at least one dielectric layer 100 to the other end portion at which the second-type first metal line 30 laterally contacts a second-type third metal line 130. One end portion of the at least one second-type first metal line 30 laterally contacts the second-type third metal line 130. The constant width of a second-type first metal line 30 may be a constant first-line width w, which may be a critical dimension. Preferably, the constant width of a second-type first metal line 30 is the same as the constant width of a first-type first metal line 10 in a first-type interdigitated structure (10, 110, 20).

Each of the at least one second-type second metal line 40 may have a constant width throughout, which may be the constant second-line width w'.

Each of the at least one second-type first metal line 30 may be separated from one of the at least one second-type second metal line 40 by a constant spacing d throughout the length of the second-type first metal line 30. The constant spacing d may be a critical dimension for a spacing between neighboring lines in a nested parallel line structure. Preferably, the constant spacing between a second-type first metal line 30 and a second-type second metal line 40 is the same as the constant spacing between a first-type first metal line 10 and a first-type second metal line 20 in a first-type interdigitated structure (10, 110, 20).

One end of each second-type second metal line 40 laterally contacts the second-type fourth metal line 140. Each second-type second metal line 40 in a second-type interdigitated structure (30, 130, 40, 140) is resistively connected to the second-type fourth metal line 140 within the second-type interdigitated structure (30, 130, 40, 140).

All of the at least one second-type first metal line 30 and the second-type third metal line 130 within a second-type interdigitated structure (30, 130, 40, 140) are of integral construction. All of the at least one second-type second metal line 40 and the second-type fourth metal line 140 within a second-type interdigitated structure (30, 130, 40, 140) are of integral construction. All of the at least one second-type first metal line 30, the at least one second-type second metal line 40, the second-type third metal line 130, and the second-type fourth metal line 140 within a second-type interdigitated structure (30, 130, 40, 140) may be of the same material composition, and comprises at least conductive material, which may be selected from a metal and a metal compound. Non-limiting examples of the metal and the metal compound include W, Cu, Al, WN, TiN, TaN, and a combination thereof. Preferably, all of the at least one second-type first metal line 30, the at least one second-type second metal line 40, the second-type third metal line 130, and the second-type fourth metal line 140 within a second-type interdigitated structure (30, 130, 40, 140) consist of conductive materials.

All of a top surface and all of a bottom surface and a pair of sidewall surfaces of each of the at least one second-type first metal line 30 contact the at least one dielectric layer 100. Thus, all surfaces of the at least one second-type first metal line 30 not contacting a second-type third metal line 130 contact the at least one dielectric layer 100. All top surfaces of the at least one second-type first metal line 30, the at least one second-type second metal line 40, the second-type third metal line 130 and, the second-type fourth metal line 140 within a second-type interdigitated structure (30, 130, 40, 140) may be coplanar, i.e., located within a same horizontal plane. All bottom surfaces of the at least one second-type first metal line 30, the at least one second-type second metal line 40, the second-type third metal line 130, and the second-type fourth metal line 140 within a second-type interdigitated structure (30, 130, 40, 140) may be coplanar.

The at least one first vertical conductive via and the at least one second vertical conductive via provide vertical electrical connection between various elements of interdigitated structures located at adjacent vertical levels. The at least one first vertical conductive via includes at least one first-type first vertical conductive via 112 and at least one second-type first vertical conductive via 132. The at least one second vertical conductive via includes at least one first-type second vertical conductive via 22 and at least one second-type second vertical conductive via 42.

Each of the at least one first-type first vertical conductive via 112 has a top surface vertically contacting a first-type third metal line 110 in a first-type interdigitated structure (10, 110, 20) in one level and a bottom surface vertically contacting another first-type third metal line 110 in another first-type interdigitated structure (10, 110, 20) in another level. Each of the at least one second-type first vertical conductive via 132 has a top surface or a bottom surface that vertically contacts a first-type third metal line 110 in a first-type interdigitated structure (10, 110, 20) in one level and a bottom surface or a top surface that vertically contacts a second-type third metal line 130 in a second-type interdigitated structure (30, 130, 40, 140) in another level. Thus, a first-type first vertical conductive via 112 vertically contacts two first-type third metal lines 110, and a second-type first vertical conductive via 132 vertically contacts a first-type third metal line 110 and a second-type third metal line 130.

Each of the at least one first-type second vertical conductive via 22 has a top surface vertically contacting a first-type second metal line 20 in a first-type interdigitated structure (10, 110, 20) in one level and a bottom surface vertically contacting another first-type second metal line 20 in another first-type interdigitated structure (10, 110, 20) in another level. Each of the at least one second-type second vertical conductive via 42 has a top surface or a bottom surface that vertically contacts a first-type second metal line 20 in a first-type interdigitated structure (10, 110, 20) in one level and a bottom surface or a top surface that vertically contacts a second-type second metal line 40 in a second-type interdigitated structure (30, 130, 40, 140) in another level. Thus, a first-type second vertical conductive via 22 vertically contacts two first-type second metal lines 20, and a second-type second vertical conductive via 42 vertically contacts a first-type second metal line 20 and a second-type second metal line 40.

The first exemplary device structure is a vertical stack of a plurality of interdigitated structures including at least one first-type interdigitated structure (10, 110, 20) and optionally including at least one second-type interdigitated structure (30, 130, 40, 140). Each interdigitated structure in the first exemplary device structure is electrically connected to at least another interdigitated structure by the at least one first vertical conductive via (112, 132) and at the at least one second vertical conductive via (22, 42). Preferably, each of the second-type interdigitated structure (30, 130, 40, 140), if present, is located at the topmost level and/or at the bottommost level of the first exemplary device structure.

In the first exemplary device structure, all sidewall surfaces of the at least one first metal line (10, 30) other than vertical end surfaces of the at least one second-type first metal line 30 are parallel to one another.

The first exemplary device structure is a capacitor structure. All of the at least one first metal line (10, 30) and the at least one third metal line (110, 130) are resistively connected to one another, and are electrically isolated from the at least one second metal line (20, 40), and all of the at least one second metal line (20, 40) are resistively connected to each other or one another. All of the at least one first metal line (10, 30) and the plurality of third metal lines (110, 130) constitute one electrode of the capacitor structure. All of the at least one second metal line (20, 40) and optionally, the at least one fourth metal line 140 are resistively connected to one another to constitute another electrode of the capacitor structure.

Each of the interdigitated structures may be formed concurrently with at least one interconnect-level metal line in the same level within the at least one dielectric layer 100. The at least one interconnect-level metal line may include first-type interconnect-level lines 420 that are formed at the same level as a first-type interdigitated structure (10, 110, 20) and second-type interconnect-level lines 440 that are formed at the same level as a second-type interdigitated structure (30, 130, 40, 140). The at least one interconnect-level metal line has a top surface that is coplanar with a top surface of one of the at least one first metal line (10, 30) and one of the at least one second metal line (20, 40). A metal interconnect structure including the at least one interconnect-level metal line may be resistively connected to a semiconductor device on a substrate, on which the at least one dielectric layer 100 is formed.

Each of the at least one interconnect-level metal line (420, 440) may be formed concurrently with the formation of a first-type interdigitated structure (10, 110, 20) or a second-type interdigitated structure (30, 130, 40, 140) by deposition and planarization of a metal layer in trenches located within the at least one dielectric layer 100. Each interconnect metal via (422, 442) may be formed concurrently with the formation of first-type conductive vias (112, 22) in the same level or second-type conductive vias (132, 42) in the same level.

Referring to FIGS. 2A-2D, a second exemplary device structure according to a second embodiment of the present invention includes at least one dielectric layer 100, a plurality of interdigitated structures embedded therein, at least one first vertical conductive via (112, 132), and at least one second vertical conductive via (22, 42) as in the first embodiment.

The plurality of interdigitated structures are embedded in the at least one dielectric layer 100 as in the first embodiment. Further, each interdigitated structure is formed at a line level of a metal interconnect structure as in the first embodiment. The second exemplary device structure includes at least two first-type interdigitated structures located at different levels and interconnected by vertical conductive vias, and may optionally include at least one second-type interdigitated structure. Each interdigitated structure is vertically spaced from each other or one another. Each interdigitated structure includes at least one first metal line, at least one second metal line, and a third metal line.

A first-type interdigitated structure includes at least one first-type first metal line 10, at least one first-type second metal line 20, and a first-type third metal line 110. The at least one first-type first metal line 10 and the at least one first-type second metal line 20 have the same structural and compositional characteristics as in the first embodiment. Each first-type third metal line 110 has the same compositional characteristics as in the first embodiment.

Within each first-type interdigitated structure (10, 110, 20), the third metal line 110 is located on a periphery of the first-type interdigitated structure (10, 110, 20) and laterally encloses the at least one first-type first metal line 10 and the at least one first-type second metal line 20 within the first-type interdigitated structure (10, 110, 20). The first-type third metal line 110 may, or may not, have an equal length and width, i.e., the length of a pair of parallel outer sidewalls of the first-type third metal line 110 may, or may not, be the same as the length of another pair of parallel outer sidewalls of the first-type third metal line 110. The first-type third metal line 110 (excluding the at least one first-type first metal line 10 that laterally contacts the first-type third metal line 110) is of integral construction and is topologically homeomorphic to a torus, i.e., ring-shaped. Each of the at least one first-type first metal line 10 laterally contacts a first-type third metal line 110 at two locations. Each of the at least one first-type second metal line 20 does not laterally contact any conductive structure.

In the second exemplary device structure, each vertically adjacent pair of first-type interdigitated structures (10, 110, 20) have different orientations of the lengthwise direction of the at least one first-type first metal line 10 and the at least one first-type second metal line 20. Specifically, at least one first-type first metal line 10 in a first-type interdigitated structure (10, 110, 20) has sidewall surfaces that are orthogonal to sidewall surfaces of at least one first-type first metal line 10 in a vertically adjacent first-type interdigitated structure (10, 110, 20). A pair of first-type interdigitated structures (10, 110, 20) is "vertically adjacent" if there is no intervening interdigitated structure between the pair of first-type interdigitated structures (10, 110, 20). Thus, in a vertical stack of first-type interdigitated structures (10, 110, 20) interconnected by first-type vertical conductive vias (112, 22), the orientations of the planes of the at least one first-type first metal line 10 alternate between two orientations across each pair of vertically adjacent first-type interdigitated structures (10, 110, 20). Optionally, at least one second-type interdigitated structure (30, 130, 40, 140) having the same structural and compositional characteristics as in the first embodiment may be connected to a top-level first-type interdigitated structure (10, 110, 20) and/or a bottom level first-type interdigitated structure (10, 110, 20).

Such alternation of the orientations of the planes of the at least one first-type first metal line 10 increases inter-layer capacitive coupling between a first electrode and a second electrode of a capacitor structure. The first electrode includes all of the at least one first metal line (10, 30), the plurality of third metal lines (110, 130), and at least one first vertical conductive via (112, 132). The second electrode includes all of the at least one second metal line (20, 40), the at least one first-type second vertical conductive via 22, the at least one second-type vertical conductive via 42, and optionally, the at least one fourth metal line 140.

Figure 3A:
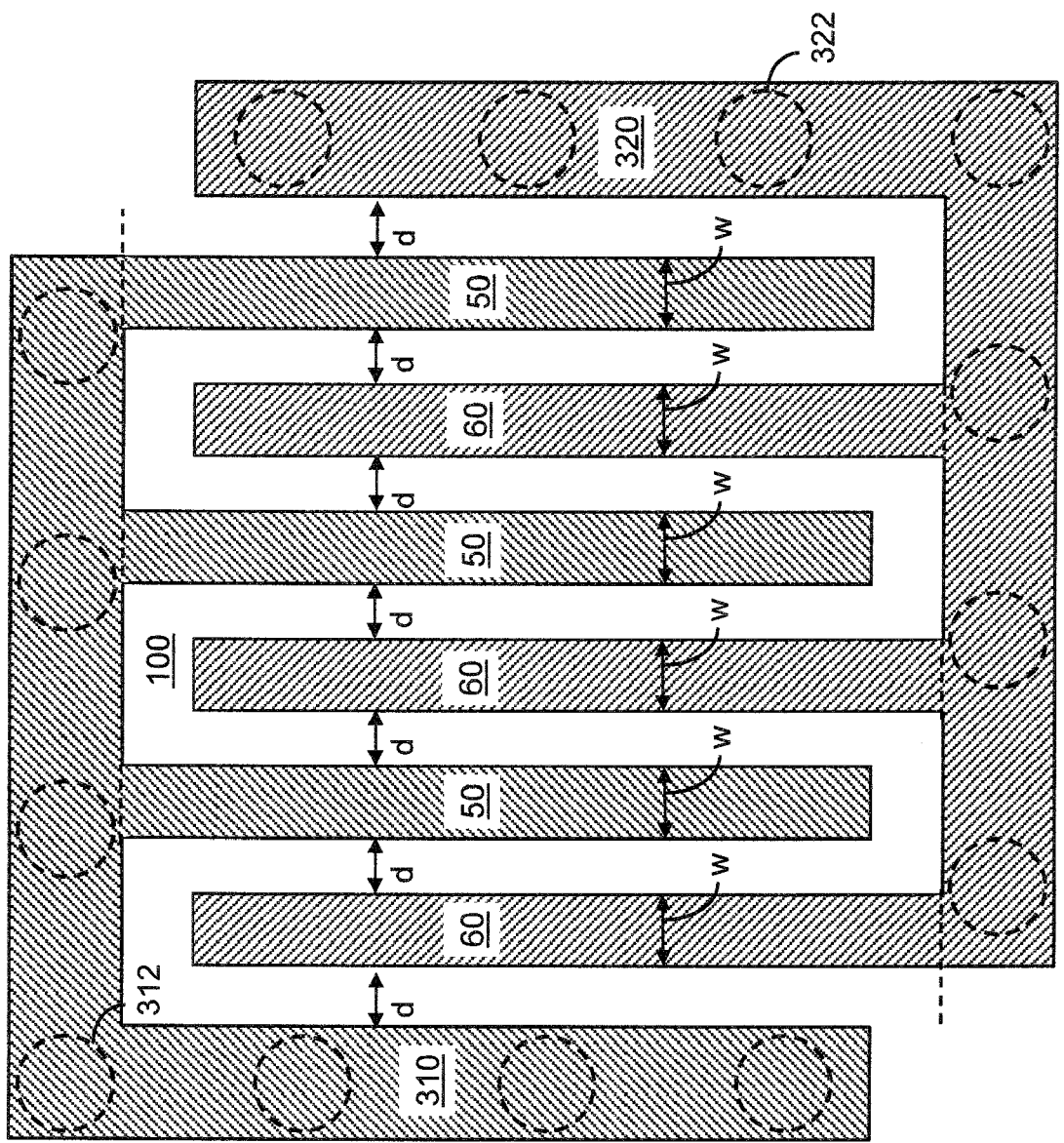
FIG. 3A is a horizontal cross-sectional view of one of third-type interdigitated structures in a third exemplary device structure according to a third embodiment of the present invention.
Figure 3B:
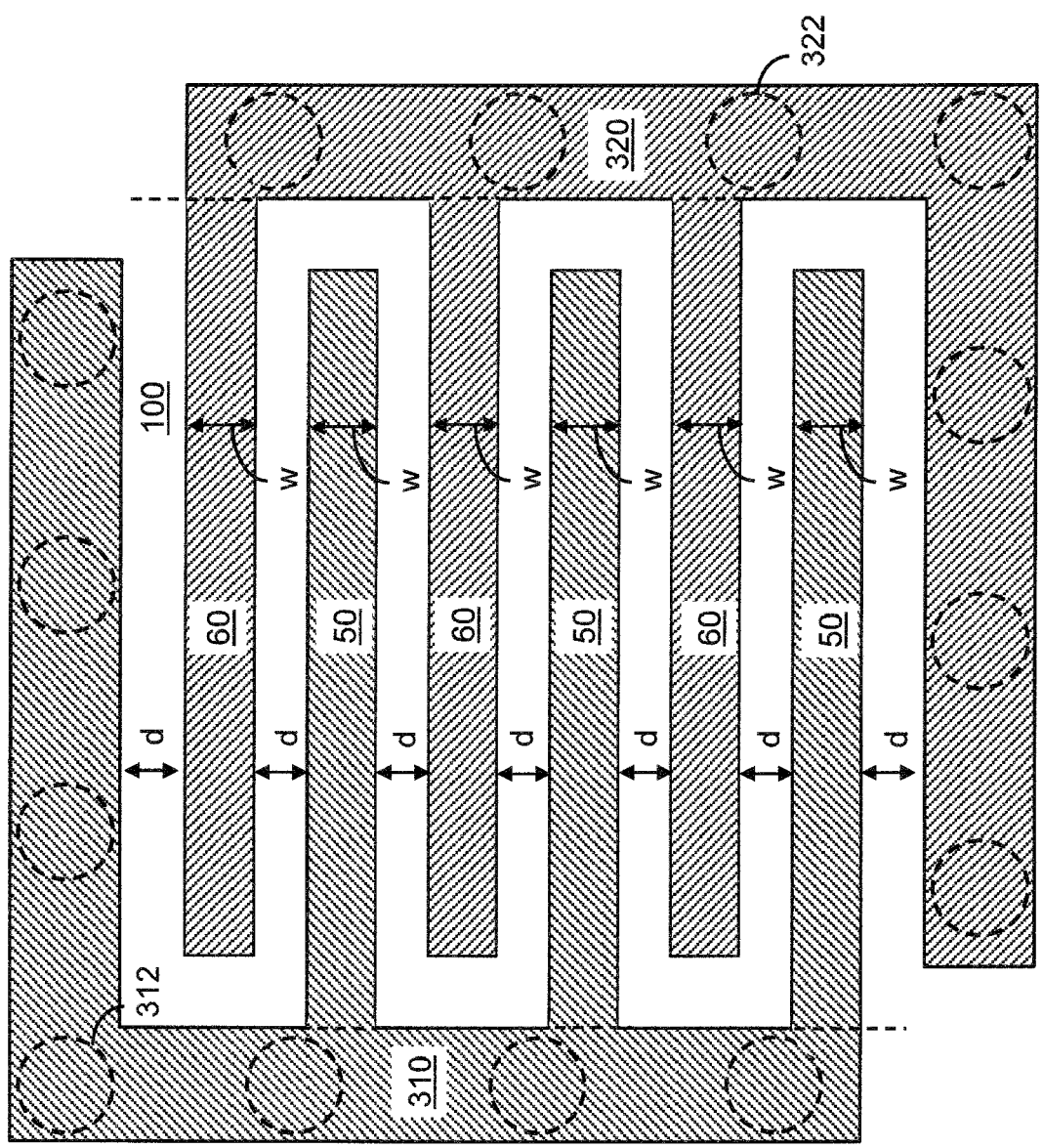
FIG. 3B is a horizontal cross-sectional view of another of third-type interdigitated structures in the third exemplary device structure according to a third embodiment of the present invention.

Referring to FIGS. 3A and 3B, a third exemplary device structure including a plurality of third-type interdigitated structures is shown. The third exemplary device structure includes at least one dielectric layer 100 located on a substrate (not shown), a plurality of third-type interdigitated structures embedded in the at least one dielectric layer 100 and vertically spaced from each other or one another, at least one first vertical conductive via 312, and at least one second vertical conductive via 322.

A third-type interdigitated structure includes at least one third-type first metal line 50, at least one third-type second metal line 60, and a third-type third metal line 310 and a third-type fourth metal line 320. Each of the at least one third-type first metal line 50 and the at least one third-type second metal line 60 may have a rectangular horizontal cross-sectional area. The third-type third metal line 310 and the third-type fourth metal line 320 may have an L-shaped horizontal cross-sectional area. Each of the at least one third-type first metal line 50 in a third-type interdigitated structure (50, 310, 60, 320) may be laterally spaced at a constant distance d from one of the at least one third-type second metal line 60 within the same third-type interdigitated structure (50, 310, 60, 320).

Each of the at least one third-type first metal line 50 may have a constant width throughout, i.e., from one end portion having a vertical end surface that contacts the at least one dielectric layer 100 to the other end portion at which the third-type first metal line 50 laterally contacts a third-type third metal line 310. One end portion of the at least one third-type first metal line 50 laterally contacts a third-type third metal line 310. The constant width of a third-type first metal line 50 is herein referred to as a constant first-line width w, which may be a critical dimension, i.e., the smallest dimension that may be printed by lithographic methods, for a line width in a nested parallel line structure.

Each of the at least one third-type second metal line 60 may have a constant width throughout, i.e., from one end portion having a vertical end surface that contacts the at least one dielectric layer 100 to the other end portion at which the third-type second metal line 60 laterally contacts a third-type fourth metal line 320. One end portion of the at least one third-type second metal line 60 laterally contacts a third-type fourth metal line 320. The constant width of a third-type second metal line 60 is herein referred to as a constant second-line width, which may, or may not, be the same as the constant first-line width w. Preferably, the constant first-line width w is the same as the constant second-line width, and is a critical dimension for a line width in a nested parallel line structure.

Each of the at least one third-type first metal line 50 may be laterally spaced from one of the at least one third-type second metal line 60 by a constant spacing d throughout the length of the third-type first metal line 50. The constant spacing d may be a critical dimension for a spacing between neighboring lines in a nested parallel line structure.

All of the at least one third-type first metal line 50 and the third-type third metal line 310 within a third-type interdigitated structure (50, 310, 60, 320) are of integral construction. All of the at least one third-type second metal line 60 and the third-type fourth metal line 320 within a third-type interdigitated structure (50, 310, 60, 320) are of integral construction. All of the at least one third-type first metal line 50, the at least one third-type second metal line 60, the third-type third metal line 310, and the third-type fourth metal line 320 within a third-type interdigitated structure (50, 310, 60, 320) may be of the same material composition, which material comprises at least conductive material, which may be selected from a metal and a metal compound. Non-limiting examples of the metal and the metal compound include W, Cu, Al, WN, TiN, TaN, and a combination thereof. Preferably, all of the at least one third-type first metal line 50, the at least one third-type second metal line 60, the third-type third metal line 310, and the third-type fourth metal line 320 within a third-type interdigitated structure (50, 310, 60, 320) consist of conductive materials.

All of a top surface and all of a bottom surface, i.e., the entirety of the top surface and the entirety of the bottom surface, and a pair of sidewall surfaces of each of the at least one third-type first metal line 50 contact the at least one dielectric layer 100. Thus, all surfaces of the at least one third-type first metal line 50 not contacting a third-type third metal line 310 contact the at least one dielectric layer 100. Likewise, all surfaces of the at least one third-type second metal line 60 not contacting a third-type fourth metal line 320 contact the at least one dielectric layer 100. All top surfaces of the at least one third-type first metal line 50, the at least one third-type second metal line 60, the third-type third metal line 310, and the third-type fourth metal line 320 within a third-type interdigitated structure (50, 310, 60, 320) may be coplanar, i.e., located within a same horizontal plane. All bottom surfaces of the at least one third-type first metal line 50, the at least one third-type second metal line 60, the third-type third metal line 310, and the third-type fourth metal line 320 within a third-type interdigitated structure (50, 310, 60, 320) may be coplanar.

The third exemplary device structure includes at least two third-type interdigitated structures (50, 310, 60, 320) located at different levels and interconnected by vertical conductive vias. Each third-type interdigitated structure (50, 310, 60, 320) is vertically spaced from each other or one another. The third-type vertical conductive vias include at least one third-type first vertical conductive via 312 and at least one third-type second vertical conductive via 322. Each third-type first conductive via 312 has a top surface that vertically contacts a third-type third metal line 310 above and a bottom surface that vertically contacts another third-type third metal line 310 below. Each third-type second conductive via 322 has a top surface that vertically contacts a third-type fourth metal line 320 above and a bottom surface that vertically contacts another third-type fourth metal line 320 below.

In the third exemplary device structure, each vertically adjacent pair of third-type interdigitated structure (50, 310, 60, 320) have different orientations of the lengthwise direction of the at least one third-type first metal line 50 and the at least one third-type second metal line 60. Specifically, at least one third-type first metal line 50 in a third-type interdigitated structure (50, 310, 60, 320) has sidewall surfaces, which are perpendicular to the direction of the spacing d within the same third-type interdigitated structure (50, 310, 60, 320) and are orthogonal to sidewall surfaces of at least one third-type first metal line 50 in a vertically adjacent third-type interdigitated structure (50, 310, 60, 320). A pair of third-type interdigitated structure (50, 310, 60, 320) is "vertically adjacent" if there is no intervening interdigitated structure between the pair of third-type interdigitated structure (50, 310, 60, 320). Thus, in a vertical stack of third-type interdigitated structure (50, 310, 60, 320) interconnected by third-type vertical conductive vias (312, 322), the orientations of the planes of the at least one third-type first metal line 50 alternate between two orientations across each pair of vertically adjacent third-type interdigitated structure (50, 310, 60, 320).

Such alternation of the orientations of the planes of the at least one third-type first metal line 50 increases inter-layer capacitive coupling between a first electrode and a second electrode of a capacitor structure.

The first electrode includes all of the third-type first metal lines 50, all of the third-type third metal lines 310, and all of the at least one third-type first vertical conductive via 312, which are resistively connected to one another. The second electrode includes all of the at least one third-type second metal line 60, all of the third-type fourth metal lines 320, and all of the at least one third-type second vertical conductive via 322, which are resistively connected to one another.

As in the previous embodiments, at least one interconnect-level metal line (420, 440) and interconnect metal via (422, 442) may be formed in the third exemplary device, although these structures are not explicitly shown in FIGS. 3A and 3B. Each of the at least one interconnect-level metal line (420, 440) may be formed concurrently with the formation of a third-type interdigitated structure (50, 310, 60, 320) by deposition and planarization of a metal layer in trenches located within the at least one dielectric layer 100. Each interconnect metal vias (422, 442) may be formed concurrently with the formation of third-type conductive vias (312, 322) in the same level.

Embodiments, in which multiple instances of the third exemplary device structure are replicated laterally without direct contact between multiple third-type third metal lines 310 and/or multiple third-type fourth metal lines 320, are explicitly contemplated herein.

Figure 4:
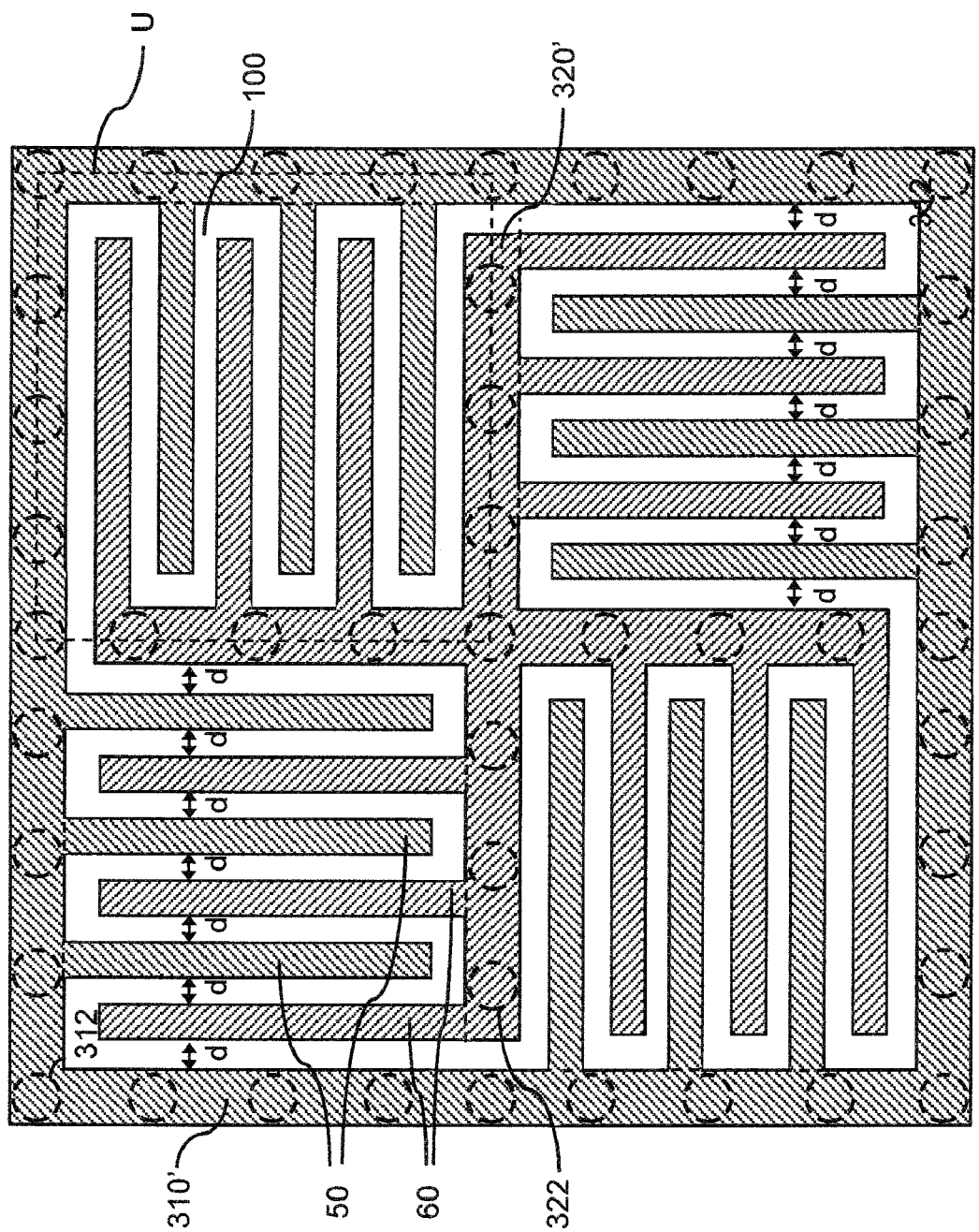
FIG. 4 is a horizontal cross-sectional view of a fourth-type interdigitated structure in a fourth exemplary device structure according to a fourth embodiment of the present invention.

Referring to FIG. 4, a fourth-type interdigitated structure is shown. A plurality of fourth-type interdigitated structures may be vertically stacked to form a fourth exemplary device structure according to a fourth embodiment of the present invention.

The fourth-type interdigitated structure may be formed by laterally replicating multiple instances of a third-type interdigitated structure (50, 310, 60, 320) of the third embodiment of the present invention while providing direct contact between multiple third-type third metal lines 310 and/or multiple third-type fourth metal lines 320. Some instance of a third-type interdigitated structure (50, 310, 60, 320) incorporated into a fourth-type interdigitated structure (50, 310', 60, 320') may be rotated 90 degrees from another instance of the third-type interdigitated structures (50, 310, 60, 320). In this case, sidewall surfaces, which are herein referred to as "first sidewall surfaces," of one of a plurality of third-type first metal lines 50 within a fourth-type interdigitated structure (50, 310', 60, 320') are orthogonal to some other sidewall surfaces, which are herein referred to as "second sidewall surfaces," of another of the plurality of third-type first metal lines 50 within the fourth-type interdigitated structure (50, 310', 60, 320'). In some cases, the fourth-type interdigitated structure (50, 310', 60, 320') may include multiple instances of a unit cell U, which includes all elements of a third-type interdigitated structure (50, 310, 60, 320) of the third embodiment. The unit cell U may be replicated with a rotation by integer multiples of 90 degrees around a surface normal of a substrate, which is a vertical axis that is normal to the substrate, i.e., the direction that is perpendicular to the plane of FIG. 4.

The multiple third-type third metal lines 310 of the multiple third-type interdigitated structures (50, 310, 60, 320) are merged into a fourth-type third metal line 310'. Likewise, the multiple third-type fourth metal lines 320 of the multiple third-type interdigitated structures (50, 310, 60, 320) are merged into a fourth-type fourth metal line 320'. For example, a fourth-type third metal line 310' in a fourth-type interdigitated structure (50, 310', 60, 320') may be located on a periphery of the fourth-type interdigitated structure (50, 310', 60, 320') and laterally enclose the plurality of third-type first metal lines 50, the plurality of third-type second metal lines 60, and the fourth-type fourth metal line 320'. The fourth-type third metal line 310' (which excludes the plurality of third-type first metal lines 50) is of integral construction and is topologically homeomorphic to a torus. A fourth-type fourth metal line 320' may have a shape of a crosshair, and is of integral construction.

The plurality of third-type first metal lines 50 of the fourth-type interdigitated structure (50, 310', 60, 320') may have the same structural and compositional characteristics as the at least one third-type first metal line 50 of a third-type interdigitated structure (50, 310, 60, 320). The plurality of third-type second metal lines 60 of the fourth-type interdigitated structure (50, 310', 60, 320') may have the same structural and compositional characteristics as the at least one third-type second metal line 60 of a third-type interdigitated structure (50, 310, 60, 320).

The fourth exemplary device structure includes at least one dielectric layer 100 located on a substrate (not shown), a plurality of fourth-type interdigitated structures (50, 310', 60, 320') embedded in the at least one dielectric layer 100 and vertically spaced from each other or one another, a plurality of third-type first vertical conductive vias 312, and a plurality of third-type second vertical conductive vias 322. As in the third embodiment, each third-type first vertical conductive via 312 has a top surface vertically contacting a fourth-type third metal line 310' in a fourth-type interdigitated structure (50, 310', 60, 320') in one level and a bottom surface vertically contacting another fourth-type third metal line 310' in another fourth-type interdigitated structure (50, 310', 60, 320') in another level. Likewise, each third-type second vertical conductive via 322 has a top surface vertically contacting a fourth-type third metal line 310' in a fourth-type interdigitated structure (50, 310', 60, 320') in one level and a bottom surface vertically contacting another fourth-type third metal line 310' in another fourth-type interdigitated structure (50, 310', 60, 320') in another level.

Fourth-type interdigitated structures (50, 310', 60, 320') located at different levels within the fourth exemplary device structure may, or may not, have identical designs. In one case, all fourth-type interdigitated structures (50, 310', 60, 320') within a fourth exemplary device structure are vertical replications without rotation of a single fourth-type interdigitated structure (50, 310', 60, 320'). In another case, an area of a fourth-type interdigitated structure (50, 310', 60, 320') having a first pair of parallel sidewall surfaces of a third-type first metal line 50 vertically overlaps, i.e., overlaps in a see-through top-down view, an area of another fourth-type interdigitated structure (50, 310', 60, 320') having a second pair of parallel sidewall surfaces of another third-type first metal line 50 that are orthogonal to the sidewall surfaces of the first pair. In a preferred embodiment, a fourth exemplary device structure includes a vertical stack of multiple fourth-type interdigitated structures (50, 310', 60, 320') such that the orientations of the planes of the sidewall surfaces of the at least one third-type first metal line 50 alternate between two orientations across each pair of vertically adjacent fourth-type interdigitated structures (50, 310', 60, 320'). This embodiment increases capacitance of the fourth exemplary device structure, which is a capacitor structure, by increasing inter-layer capacitive coupling.

The fourth exemplary structure, which employs a stack of fourth-type interdigitated structures, provides an improved high frequency behavior in capacitance, i.e., less decrease in the capacitance at high frequencies, compared with the third exemplary structure for two reasons. First, the current during high frequency operation of the fourth exemplary structure as a capacitor is distributed over more metallic volume that includes the fourth-type third metal line 310' and the fourth-type fourth metal line 320' relative to volumes of the third-type third metal line 310 and the third-type fourth metal line 320 of the third embodiment. Second, the sizes of the third-type first metal lines 50 and third-type second metal lines 60 may be reduced in a fourth exemplary structure relative to a third exemplary structure having a comparable capacitance because the size of each of the third-type first metal lines 50 and third-type second metal lines 60 may be set to generate a lesser fraction of the total capacitance. For example, if a fourth exemplary structure includes an equivalent of four of third exemplary structures, each of the fingers represented by the third-type first metal lines 50 and third-type second metal lines 60 in the fourth exemplary structure would have approximately ½ the length of a finger of a third exemplary structure having an equivalent capacitance at low frequency. The reduction of the length of the finger in the configuration of the fourth exemplary structure results in reduction of the total resistance of the fingers in the fourth exemplary structure, and hence improved high frequency characteristics of the fourth exemplary structure relative to a third exemplary structure having a comparable low frequency capacitance.

Figure 5:
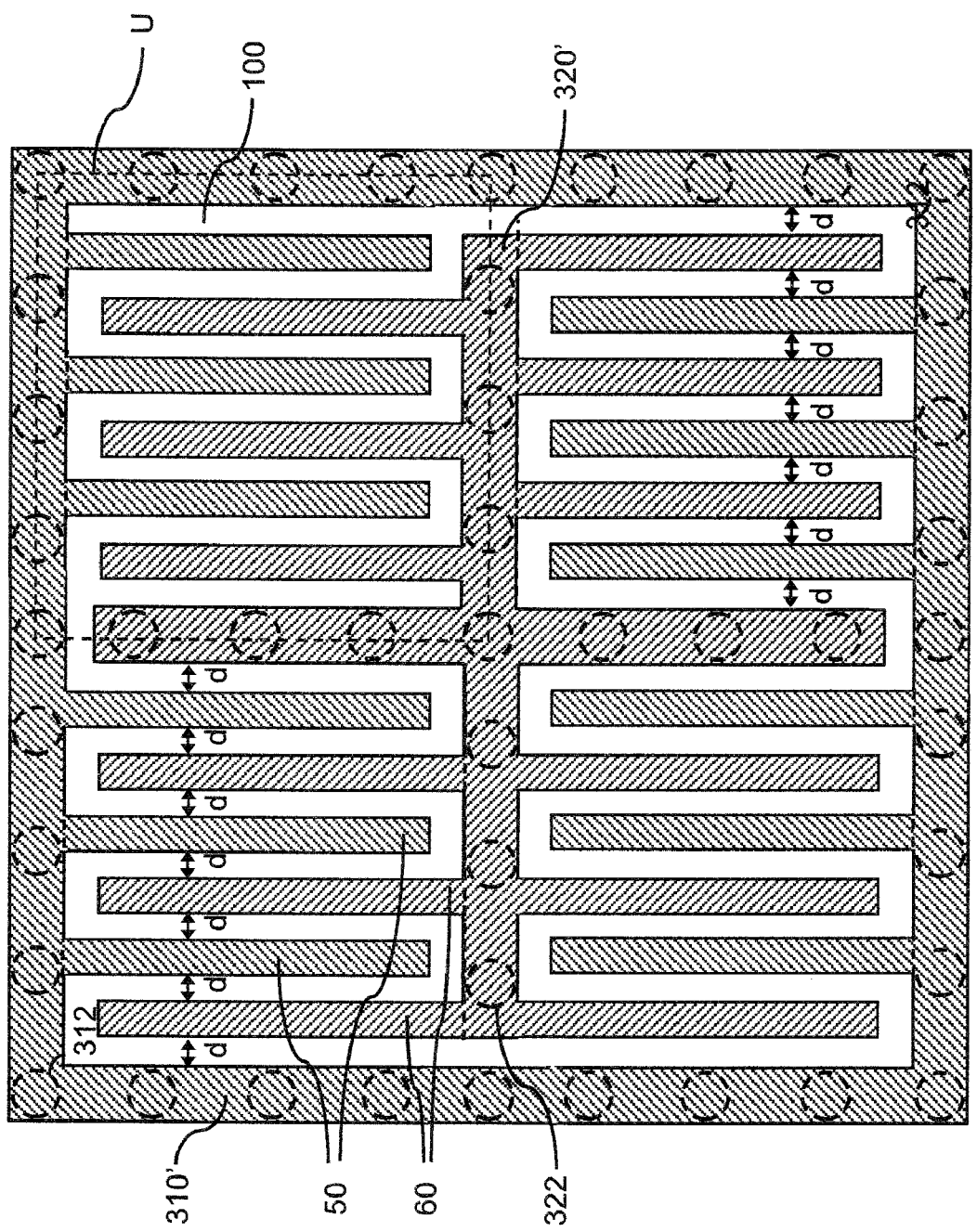
FIG. 5 is a horizontal cross-sectional view of a fifth-type interdigitated structure in a fifth exemplary device structure according to a fifth embodiment of the present invention.

Referring to FIG. 5, a fifth-type interdigitated structure is shown. A plurality of fifth-type interdigitated structures may be vertically stacked to form a fifth exemplary device structure according to a fifth embodiment of the present invention.

The fifth-type interdigitated structure may be formed by laterally replicating multiple instances of a third-type interdigitated structure (50, 310, 60, 320) of the third embodiment of the present invention while providing direct contact between multiple third-type third metal lines 310 and/or multiple third-type fourth metal lines 320 as in the fourth embodiment. All instances of a third-type interdigitated structure (50, 310, 60, 320) incorporated into a fifth-type interdigitated structure (50, 310', 60, 320') have the same orientation or a mirror symmetry. In contrast to the fourth embodiment, 90 degree rotations are not employed among instances of the third-type interdigitated structure (50, 310, 60, 320). All sidewall surfaces of the plurality of third-type first metal lines 50 within a fifth-type interdigitated structure (50, 310', 60, 320') are parallel to one another. Because sidewall surfaces of the plurality of third-type second metal lines 60 are parallel to the nearest sidewall surface of a third-type first metal line 50, all sidewall surfaces of the plurality of third-type first metal lines 50 and all sidewall surfaces of the plurality of third-type second metal lines 60 are parallel to one another within a fifth-type interdigitated structure (50, 310', 60, 320').

In some cases, the fifth-type interdigitated structure (50, 310', 60, 320') may include multiple instances of a unit cell U. Such multiple instances of the unit cell U may be a replication of the unit cell without rotation. Optionally, replicated instances of the unit cell U may have a mirror symmetry relative to the unit cell U.

The multiple third-type third metal lines 310 of the multiple third-type interdigitated structures (50, 310, 60, 320) are merged into a fourth-type third metal line 310'. Likewise, the multiple third-type fourth metal lines 320 of the multiple third-type interdigitated structures (50, 310, 60, 320) are merged into a fourth-type fourth metal line 320'. For example, a fourth-type third metal line 310' in a fifth-type interdigitated structure (50, 310', 60, 320') may be located on a periphery of the fifth-type interdigitated structure (50, 310', 60, 320') and laterally enclose the plurality of third-type first metal lines 50, the plurality of third-type second metal lines 60, and the fourth-type fourth metal line 320'. The fifth-type third metal line 310 (which excludes the plurality of third-type first metal lines 50) is of integral construction and is topologically homeomorphic to a torus. A fourth-type fourth metal line 320' may have a shape of a crosshair, and is of integral construction.

The plurality of third-type first metal lines 50 of the fifth-type interdigitated structure (50, 310', 60, 320') may have the same structural and compositional characteristics as the plurality of third-type first metal lines 50 of a third-type interdigitated structure (50, 310, 60, 320). The plurality of third-type second metal lines 60 of the fifth-type interdigitated structure (50, 310', 60, 320') may have the same structural and compositional characteristics as the plurality of third-type second metal lines 60 of a third-type interdigitated structure (50, 310, 60, 320).

The fifth exemplary device structure includes at least one dielectric layer 100 located on a substrate (not shown), a plurality of fifth-type interdigitated structures (50, 310', 60, 320') embedded in the at least one dielectric layer 100 and vertically spaced from each other or one another, a plurality of third-type first vertical conductive vias 312, and a plurality of third-type second vertical conductive vias 322. As in the fourth embodiment, each third-type first vertical conductive via 312 has a top surface vertically contacting a fourth-type third metal line 310' in a fifth-type interdigitated structure (50, 310', 60, 320') in one level and a bottom surface vertically contacting another fourth-type third metal line 310' in another fifth-type interdigitated structure (50, 310', 60, 320') in another level. Likewise, each third-type second vertical conductive via 322 has a top surface vertically contacting a fourth-type fourth metal line 320' in a fifth-type interdigitated structure (50, 310', 60, 320') in one level and a bottom surface vertically contacting another fourth-type fourth metal line 320' in another fifth-type interdigitated structure (50, 310', 60, 320') in another level.

Fifth-type interdigitated structures (50, 310', 60, 320') located at different levels within the fifth exemplary device structure may, or may not, have identical designs. In one case, all fifth-type interdigitated structures (50, 310', 60, 320') within a fifth exemplary device structure are vertical replications without rotation of a single fifth-type interdigitated structure (50, 310', 60, 320'). In another case, an area of a fifth-type interdigitated structure (50, 310', 60, 320') having a first pair of parallel sidewall surfaces of a third-type first metal line 50 vertically overlaps, i.e., overlaps in a see-through top-down view, an area of another fifth-type interdigitated structure (50, 310', 60, 320') having a second pair of parallel sidewall surfaces of another third-type first metal line 50 that are orthogonal to the sidewall surfaces of the first pair. In a preferred embodiment, a fifth exemplary device structure includes a vertical stack of multiple fifth-type interdigitated structures (50, 310', 60, 320') such that the orientations of the planes of the sidewall surfaces of the at least one third-type first metal line 50 alternate between two orientations across each pair of vertically adjacent fifth-type interdigitated structures (50, 310', 60, 320'). This embodiment increases capacitance of the fifth exemplary device structure, which is a capacitor structure, by increasing inter-layer capacitive coupling.

The fifth exemplary structure, which employs a stack of fifth-type interdigitated structures, provides an improved high frequency behavior in capacitance compared with the third exemplary structure for the same reasons as the fourth exemplary structure.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a device structure comprising:
    forming a semiconductor device on a substrate;
    forming at least one dielectric layer on said substrate;
    forming at least one metal interconnect structure including at least one interconnect-level metal line;
    forming a device structure including:
        a plurality of interdigitated structures embedded in said at least one dielectric layer, wherein said plurality of interdigitated structures vertically extends across multiple line levels, and each of said plurality of interdigitated structures vertically extends over, and not beyond, a single line level among said multiple line levels, is vertically spaced from one another, and includes at least one first metal line, at least one second metal line electrically isolated from said at least one first metal line, a third metal line laterally contacting said at least one first metal line and having a different lengthwise direction than a lengthwise direction of said at least one first metal line, wherein said at least one first metal line, said at least one second metal line, and said third metal line are vertically spaced from a topmost planar surface of said substrate by a same distance, wherein all of said at least one first metal line and said plurality of third metal lines are resistively connected to one another to constitute one electrode of a capacitor structure and are electrically isolated from said at least one second metal line, and all of said at least one second metal line are resistively connected to one another to constitute another electrode of said capacitor structure, and said one of said plurality of interdigitated structures includes a second metal line having a first sidewall and a second sidewall that is parallel to said first sidewall, and a first metal line among said one of said plurality of interdigitated structures is more proximal to said first sidewall than to said second sidewall, and another first metal line among said one of said plurality of interdigitated structures is more proximal to said second sidewall than to said first sidewall;

at least one first vertical conductive via electrically connected to said at least one first metal line and said plurality of third metal lines; and at least one second vertical conductive via electrically connected to said at least one second metal line, wherein one of said at least one first metal line and said at least one interconnect-level metal line are formed concurrently by deposition and planarization of a metal layer in trenches located within said at least one dielectric layer.

2. The method of claim 1, wherein said second metal line among said one of said plurality of interdigitated structures is laterally surrounded by a contiguous structure including said first metal line among said one of said plurality of interdigitated structures and said another first metal line among said one of said plurality of interdigitated structures.

3. The method of claim 1, wherein, within each of said plurality of interdigitated structures, said at least one first metal line and said at least one second metal line have a same lengthwise direction that is different from a lengthwise direction of said a portion of at least one third metal line.

4. A device structure comprising:

at least one dielectric layer located on a substrate;

a plurality of interdigitated structures embedded in said at least one dielectric layer, wherein said plurality of interdigitated structures vertically extends across multiple line levels, and each of said plurality of interdigitated structures vertically extends over, and not beyond, a single line level among said multiple line levels, is vertically spaced from one another, and includes at least one first metal line, at least one second metal line electrically isolated from said at least one first metal line, a third metal line laterally contacting said at least one first metal line and having a different lengthwise direction than a lengthwise direction of said at least one first metal line, and a fourth metal line laterally contacting said at least one second metal line, wherein said at least one first metal line, said at least one second metal line, said third metal line, and said fourth metal line are vertically spaced from a topmost planar surface of said substrate by a same distance;

at least one first vertical conductive via, each having a top surface vertically contacting a third metal line within one of said plurality of interdigitated structures and a bottom surface vertically contacting another third metal line within another of said plurality of interdigitated structures; and at least one second vertical conductive via, each having a top surface vertically contacting a fourth metal line within said one of said plurality of interdigitated structures and a bottom surface vertically contacting another fourth metal line within another of said plurality of interdigitated structures, wherein all of said at least one first metal line and said plurality of third metal lines are resistively connected to one another and are electrically isolated from said at least one second metal line, and all of said at least one second metal line and said plurality of fourth metal lines are resistively connected to one another, and said one of said plurality of interdigitated structures includes a second metal line having a first sidewall and a second sidewall that is parallel to said first sidewall, and a first metal line among said one of said plurality of interdigitated structures is more proximal to said first sidewall than to said second sidewall, and another first metal line among said one of said plurality of interdigitated structures is more proximal to said second sidewall than to said first sidewall.

5. The device structure of claim 4, wherein all of said at least one first metal line and said third metal line within one of said plurality of interdigitated structures are of integral construction and of the same material composition, and all of said at least one second metal line and said fourth metal line within said one of said plurality of interdigitated structures are of integral construction and of the same material composition.

6. The device structure of claim 4, wherein each of said at least one first metal line is laterally spaced from one of said at least one second metal line by a constant spacing.

7. The device structure of claim 6, wherein each of said at least one first metal line has a first constant width throughout.

8. The device structure of claim 6, wherein each of said at least one second metal line has a second constant width throughout, and wherein an entirety of a sidewall of each of said at least one first metal line is laterally spaced from a sidewall of one of said at least one second metal line by said constant spacing throughout.

9. The device structure of claim 6, wherein an end portion of each of said at least one first metal line in an interdigitated structure laterally contacts a third metal line within said one of said plurality of interdigitated structures, and an end portion of each of said at least one second metal line within said one of said plurality of interdigitated structures laterally contacts a fourth metal line within said one of said plurality of interdigitated structures.

10. The device structure of claim 6, wherein an entirety of a top surface and an entirety of a bottom surface and a pair of parallel sidewall surfaces and a vertical end surface of each of said at least one first metal line contact said at least one dielectric layer, and all of a top surface and all of a bottom surface and a pair of parallel sidewall surfaces and a vertical end surface of each of said at least one second metal line contact said at least one dielectric layer.

11. The device structure of claim 6, wherein at least one first metal line in one of said plurality of interdigitated structures have sidewall surfaces that are orthogonal to sidewall surfaces of at least one first metal line in another of said plurality of interdigitated structures, wherein said one of said plurality of interdigitated structures is vertically spaced from said another of said plurality of interdigitated structures.

12. The device structure of claim 6, wherein all sidewall surfaces of said at least one first metal line and all sidewall surfaces of said at least one second metal line are parallel to one another within one of said plurality of interdigitated structures.

13. The device structure of claim 4, wherein said second metal line among said one of said plurality of interdigitated structures is laterally surrounded by a contiguous structure including said first metal line among said one of said plurality of interdigitated structures and said another first metal line among said one of said plurality of interdigitated structures.

14. The device structure of claim 4, wherein, within each of said plurality of interdigitated structures, said at least one first metal line and said at least one second metal line have a same lengthwise direction that is different from a lengthwise direction of a portion of said third metal line.

15. A device structure comprising:
at least one dielectric layer located on a substrate;
a plurality of interdigitated structures embedded in said at least one dielectric layer, wherein said plurality of interdigitated structures vertically extends across multiple line levels, and each of said plurality of interdigitated structures vertically extends over, and not beyond, a single line level among said multiple line levels, is vertically spaced from one another, and includes at least one first metal line, at least one second metal line electrically isolated from said at least one first metal line, and at least one third metal line laterally contacting said at least one first metal line and having a different lengthwise direction than a lengthwise direction of said at least one first metal line, wherein said at least one first metal line, said at least one second metal line, and said at least one third metal line are vertically spaced from a topmost planar surface of said substrate by a same distance;
at least one first vertical conductive via having a top surface vertically contacting one of said at least one third metal line within one of said plurality of interdigitated structures and a bottom surface vertically contacting another of said at least one third metal line within another of said plurality of interdigitated structures; and
at least one second vertical conductive via having a top surface vertically contacting one of said at least one second metal line within said one of said plurality of interdigitated structures and a bottom surface vertically contacting another of said at least one second metal line within said another of said plurality of interdigitated structures,
wherein all of said at least one first metal line and said at least one third metal line are resistively connected to one another and are electrically isolated from said at least one second metal line, and all of said at least one second metal line are resistively connected to each other or one another, and said one of said plurality of interdigitated structures includes a second metal line having a first sidewall and a second sidewall that is parallel to said first sidewall, and a first metal line among said one of said plurality of interdigitated structures is more proximal to said first sidewall than to said second sidewall, and another first metal line among said one of said plurality of interdigitated structures is more proximal to said second sidewall than to said first sidewall.

16. The device structure of claim 15, wherein each of said at least one first metal line is laterally spaced from one of said at least one second metal line by a constant spacing.

17. The device structure of claim 16, wherein each of said at least one first metal line has a first constant width throughout.

18. The device structure of claim 17, wherein each of said at least one second metal line has a second constant width throughout, and wherein an entirety of a sidewall of each of said at least one first metal line is laterally spaced from a sidewall of one of said at least one second metal line by said constant spacing throughout.

19. The device structure of claim 16, wherein each end portion of said at least one first metal line laterally contacts one of said at least one third metal line.

20. The device structure of claim 16, wherein all of a top surface and all of a bottom surface and a pair of sidewall surfaces of each of said at least one first metal line contact said at least one dielectric layer.

21. The device structure of claim 16, wherein at least one first metal line in one of said plurality of interdigitated structures have sidewall surfaces that are orthogonal to sidewall surfaces of at least one first metal line in another of said plurality of interdigitated structures.

22. The device structure of claim 16, wherein one of said plurality of interdigitated structures includes two of third metal lines that do not contact each other.

23. The device structure of claim 16, wherein all of said at least one first metal line and said at least one third metal line within one of said plurality of interdigitated structures are contiguous to one another and of the same material composition.

24. The device structure of claim 15, wherein said second metal line among said one of said plurality of interdigitated structures is laterally surrounded by a contiguous structure including said first metal line among said one of said plurality of interdigitated structures and said another first metal line among said one of said plurality of interdigitated structures.

25. The device structure of claim 15, wherein, within each of said plurality of interdigitated structures, said at least one first metal line and said at least one second metal line have a same lengthwise direction that is different from a lengthwise direction of a portion of said at least one third metal line.

* * * * *